United States Patent
Kim et al.

(10) Patent No.: US 8,522,097 B2
(45) Date of Patent: Aug. 27, 2013

(54) LOGIC BUILT-IN SELF-TEST PROGRAMMABLE PATTERN BIT MASK

(75) Inventors: Hong S. Kim, Austin, TX (US); Paul F. Policke, Austin, TX (US); Paul Douglas Bassett, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 550 days.

(21) Appl. No.: 12/724,527

(22) Filed: Mar. 16, 2010

(65) Prior Publication Data

US 2011/0231719 A1 Sep. 22, 2011

(51) Int. Cl.
*G01R 31/28* (2006.01)

(52) U.S. Cl.
USPC .......................................... 714/733; 714/729

(58) Field of Classification Search
USPC ................. 365/201; 714/723, 732, 733, 726, 714/729
See application file for complete search history.

(56) References Cited

U.S. PATENT DOCUMENTS

| | | | |
|---|---|---|---|
| 5,539,753 A | 7/1996 | Connor et al. | |
| 6,957,371 B2 * | 10/2005 | Ricchetti et al. | 714/733 |
| 6,993,694 B1 | 1/2006 | Kapur et al. | |
| 7,032,148 B2 | 4/2006 | Wang et al. | |
| 7,058,869 B2 | 6/2006 | Abdel-Hafez et al. | |
| 7,237,162 B1 | 6/2007 | Wohl et al. | |
| 7,324,392 B2 * | 1/2008 | Ramamurti et al. | 365/201 |
| 7,370,251 B2 * | 5/2008 | Nadeau-Dostie et al. | 714/723 |
| 7,376,875 B2 | 5/2008 | Hilgendorf et al. | |
| 7,467,342 B2 * | 12/2008 | Ricchetti et al. | 714/733 |
| 8,166,359 B2 * | 4/2012 | Rajski et al. | 714/732 |
| 2007/0234150 A1 | 10/2007 | Jain et al. | |
| 2007/0234163 A1 | 10/2007 | Mukherjee et al. | |
| 2007/0288821 A1 | 12/2007 | Matsuo et al. | |
| 2009/0132870 A1 | 5/2009 | Burlison et al. | |

OTHER PUBLICATIONS

International Search Report and Written Opinion—PCT/US2011/028699, ISA/EPO—Oct. 24, 2011.

* cited by examiner

*Primary Examiner* — David Ton
(74) *Attorney, Agent, or Firm* — Peter Michael Kamarchik; Nicholas J. Pauley; Joseph Agusta (57) ABSTRACT

In a particular embodiment, a method is disclosed that includes mapping failing bit positions within multiple scan chains to memory locations of a memory mask. The method also includes executing logic built-in self-test (LBIST) testing on a semiconductor device using the memory mask to selectively mask certain results within the multiple scan chains. The results are associated with performance of LBIST testing on the semiconductor device.

29 Claims, 7 Drawing Sheets

LOGIC BUILT-IN SELF-TEST PROGRAMMABLE PATTERN BIT MASK

I. FIELD

The present disclosure is generally related to a logic built-in self-test (LBIST) programmable pattern bit mask.

II. DESCRIPTION OF RELATED ART

Logic built-in self-test (LBIST) testing allows an integrated circuit in a semiconductor device to test the integrity of its own circuitry. LBIST testing involves providing a stimulus to the integrated circuit logic and determining whether the integrated circuit logic responds as expected. An integrated circuit capable of performing LBIST testing typically has special test circuits for generating the stimulus and for detecting the response. Implementations of LBIST testing may generate a pseudo-random sequence as the stimulus and detect the response using a multiple input shift register (MISR). The MISR generates a "signature" that may be unique in that any failure in the integrated circuit logic results in a different signature than the signature that results without any failures in the integrated circuit logic. Multiple stimuli propagate to the MISR along multiple scan chains. A failure in the integrated circuit logic corresponds to one or more failing scan chains. Current methods of performing LBIST testing allow failing scan chains to be masked. However, by masking the failing scan chains, the test coverage drops significantly causing the LBIST testing to be less effective in production.

III. SUMMARY

In logic built-in self-test (LBIST) testing of an integrated circuit in a semiconductor device, a failure in the integrated circuit logic may correspond to one or more failing bits within one or more failing scan chains. One or more failing bits within one or more failing scan chains may be masked by leveraging a functional memory array large enough to hold the masked bit information for LBIST testing. A user may program the masked bit information to the functional memory array via a direct memory write/access process or a joint test action group (JTAG) process. When the LBIST starts to run, the scan chain data shifts from a pseudo-random pattern generator (PRPG) to a multiple input shift register (MISR). During this process, the memory mask information is read out from the functional memory array. The shift cycle and the memory read cycle are synchronous so that any failing bit within any failing scan chain can be masked for each cycle and for each scan chain. Mask control logic may control the reading from correct memory address locations in the functional memory array.

In a particular embodiment, a method is disclosed that includes mapping failing bit positions within multiple scan chains to memory locations of a memory mask. The method also includes executing logic built-in self-test (LBIST) testing on a semiconductor device using the memory mask to selectively mask certain results within the multiple scan chains. The results are associated with performance of LBIST testing on the semiconductor device.

In another particular embodiment, a method is disclosed that includes performing logic built-in self-test (LBIST) testing on a semiconductor device to generate a test output. The method includes evaluating the test output to identify failures. The method further includes diagnosing the identified failures to identify failing bit positions within multiple scan chains. The method also includes mapping the failing bit positions to memory locations of a memory mask. The method further includes re-executing the logic built-in self-test (LBIST) testing on the semiconductor device using the memory mask to selectively mask certain results of performing the LBIST testing on the semiconductor device.

In another particular embodiment, a method is disclosed that includes programming memory locations of a memory mask. The method includes executing logic built-in self-test (LBIST) testing on a semiconductor device using the memory mask to selectively mask certain results within multiple scan chains associated with performance of LBIST testing on the semiconductor device. The method further includes evaluating results of the LBIST testing. The method further includes modifying the memory mask based on the evaluation of the results.

In another particular embodiment, an apparatus is disclosed that includes an interface to a mask source. The apparatus includes a logic built-in self-test (LBIST) module configured to receive a mask from the mask source and to apply the mask to a selected sub-portion of results of a test of multiple scan chains of LBIST testing on a semiconductor device.

One particular advantage provided by at least one of the disclosed embodiments is allowing any failing bit to be masked in logic built-in self-test (LBIST) testing patterns without significantly impacting test coverage. Rather than mask an entire failing scan chain, which would significantly impact test coverage, individual failing bits within the failing scan chain may be masked in LBIST testing patterns, which would not significantly impact test coverage. Other aspects, advantages, and features of the present disclosure will become apparent after review of the entire application, including the following sections: Brief Description of the Drawings, Detailed Description, and the Claims.

V. DETAILED DESCRIPTION

Figure 1:
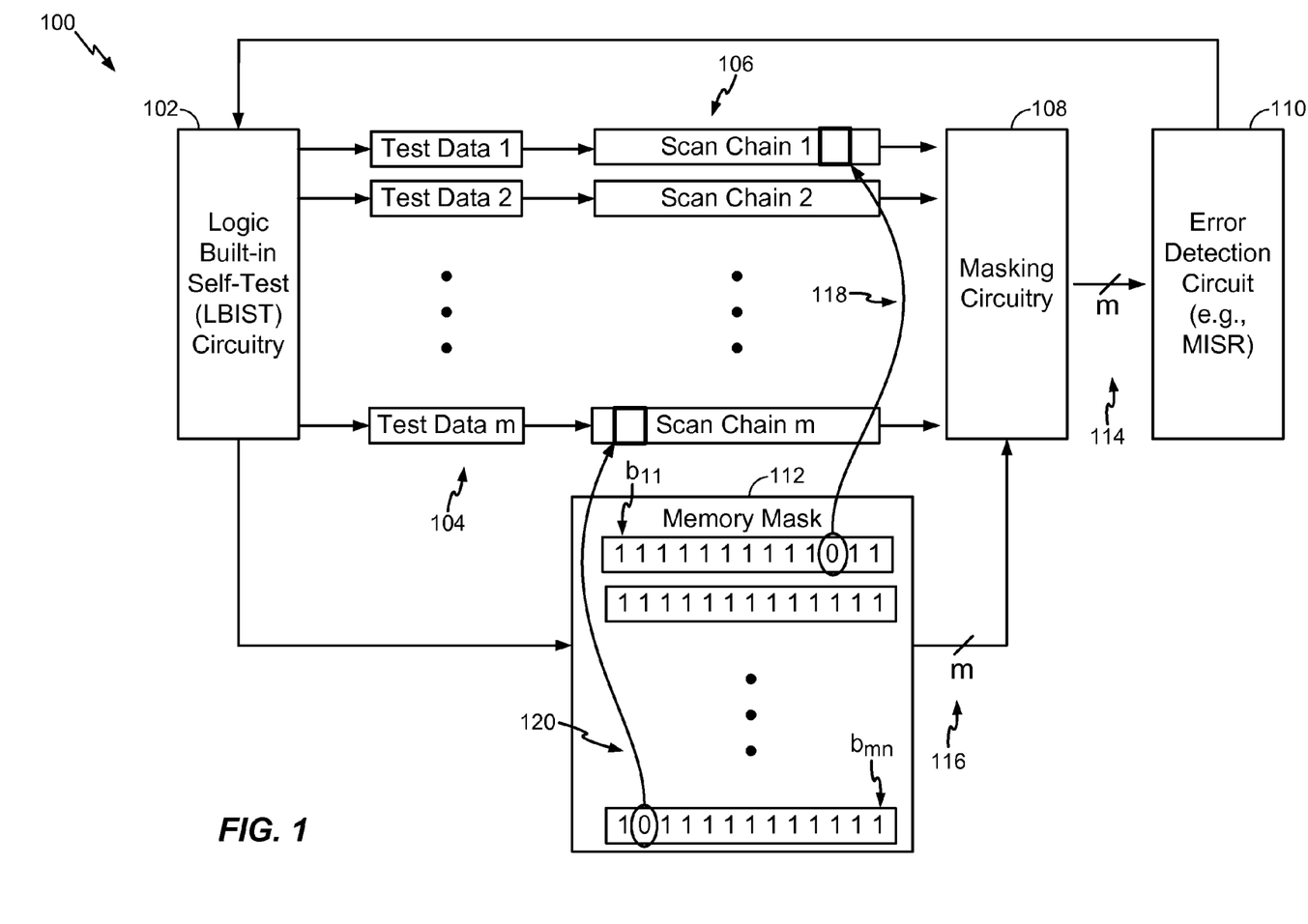
FIG. 1 is an illustrative block diagram of a first embodiment of a logic built-in self-test (LBIST) testing system having a memory mask applied to sub-portions of multiple scan chains.

Particular embodiments of the present disclosure are described with reference to the drawings. In the description, common features are designated by common reference numbers. Referring to FIG. 1, an illustrative block diagram of a first embodiment of a logic built-in self-test (LBIST) testing system having a memory mask applied to sub-portions of multiple scan chains is depicted and generally designated 100. The LBIST testing system 100 includes LBIST circuitry 102 coupled to m sets of test data 104. The m sets of test data 104 are coupled to m scan chains 106. The m scan chains 106 are coupled to masking circuitry 108. The masking circuitry 108 is coupled to an error detection circuit 110, such as a multiple input shift register (MISR), which is coupled to the LBIST circuitry 102. The LBIST circuitry 102 is also coupled to a memory mask 112. The memory mask 112 is coupled to the masking circuitry 108 via an m-bit line 116. The masking circuitry 108 is coupled to the error detection circuit 110 via an m-bit line 114.

Each of the m scan chains 106 may correspond to flip-flops or other sequential elements linked together to operate as a shift register that has up to n cycles. The bit positions in the first of the m scan chains 106 may be labeled $b_{11}$, $b_{12}$, $b_{13}$, ..., $b_{1n}$. The bit positions in the second of the m scan chains 106 may be labeled $b_{21}$, $b_{22}$, $b_{23}$, ..., $b_{2n}$. The bit positions in the third of the m scan chains 106 may be labeled $b_{31}$, $b_{32}$, $b_{33}$, ..., $b_{3n}$. The bit positions in the m-th of the m scan chains 106 may be labeled $b_{m1}$, $b_{m2}$, $b_{m3}$, ..., $b_{mn}$. The memory mask 112 has a two-dimensional array of bit positions corresponding to the bit positions of the m scan chains 106, as shown by the bit positions $b_{11}$ and $b_{mn}$ in the memory mask 112

In operation, the LBIST circuitry 102 generates the m sets of test data 104 that are applied to a semiconductor device under test (DUT). For example, the m sets of test data 104 may be generated using a pseudo-random number generator. The error detection circuit 110 may detect whether there are any unmasked failing bit positions within any of the m scan chains 106 and may generate a pass/fail indicator. For example, the error detection circuit 110 may generate a signature based on the output of the masking circuitry 108. When the generated signature does not match an expected signature, one or more bit positions have failed that have not been masked by the masking circuitry 108 and a fail indicator may be provided to the LBIST circuitry 102.

In response to determining that one or more unmasked bit positions have failed, the LBIST circuitry 102 may enter a diagnostic mode to read out one or more of the m scan chains 106 to enable comparison to an expected result, such as at an external automatic test equipment (ATE) tester (not shown). For example, the expected result of applying one of the m sets of test data 104 to the semiconductor device may be compared with the actual result to detect a particular failing bit position within one of the m scan chains 106. The LBIST circuitry 102 may map the failing bit positions within the m scan chains 106 to memory locations in the memory mask 112. The respective memory locations in the memory mask 112 may correspond to the failing bit positions within the m scan chains 106. In a particular embodiment, mapping the failing bit positions within the m scan chains 106 to the memory locations in the memory mask 112 is a one-to-one mapping.

In a particular embodiment, mapping the failing bit positions within the m scan chains 106 to the memory locations in the memory mask 112 results in a logical "zero" being stored at the memory locations in the memory mask 112 corresponding to the failing bit positions within the m scan chains 106, with a logical "one" being stored at all other memory locations in the memory mask 112. The logical "zeros" may be used to mask the failing bit positions within the m scan chains 106, as indicated by arrows 118 and 120. When a failing bit position is masked, the value associated with the masked failing bit position is not used to generate the final result in the error detection circuit 110. The masking may take place each cycle by the masking circuitry 108 using input from the memory mask 112 on the m-bit line 116. In an alternative embodiment, mapping the failing bit positions within the m scan chains 106 to the memory locations in the memory mask 112 results in a logical "one" being stored at the memory locations in the memory mask 112 corresponding to the failing bit positions within the m scan chains 106, with a logical "zero" being stored at all other memory locations in the memory mask 112.

A shift cycle and a memory read cycle may be synchronous so that any failing bit within any failing scan chain of the m scan chains 106 may be masked each of the n cycles and for each scan chain of the m scan chains 106. In this way, any failing bits may be masked in logic built-in self-test (LBIST) testing patterns without significantly impacting test coverage. Rather than masking an entire scan chain, which would significantly impact test coverage, only the failing bit (or bits) within the scan chain would be masked, which would not significantly impact test coverage. In a particular embodiment, the selected sub-portion to be masked is a single bit. For example, the arrow 118 indicates that the memory mask 112 may be configured to mask a bit in the first scan chain of the m scan chains 106, and the arrow 120 indicates that the memory mask 112 may be configured to mask a bit in the m-th scan chain of the m scan chains 106. In an alternative embodiment, the selected sub-portion to be masked includes multiple bits.

Figure 2:
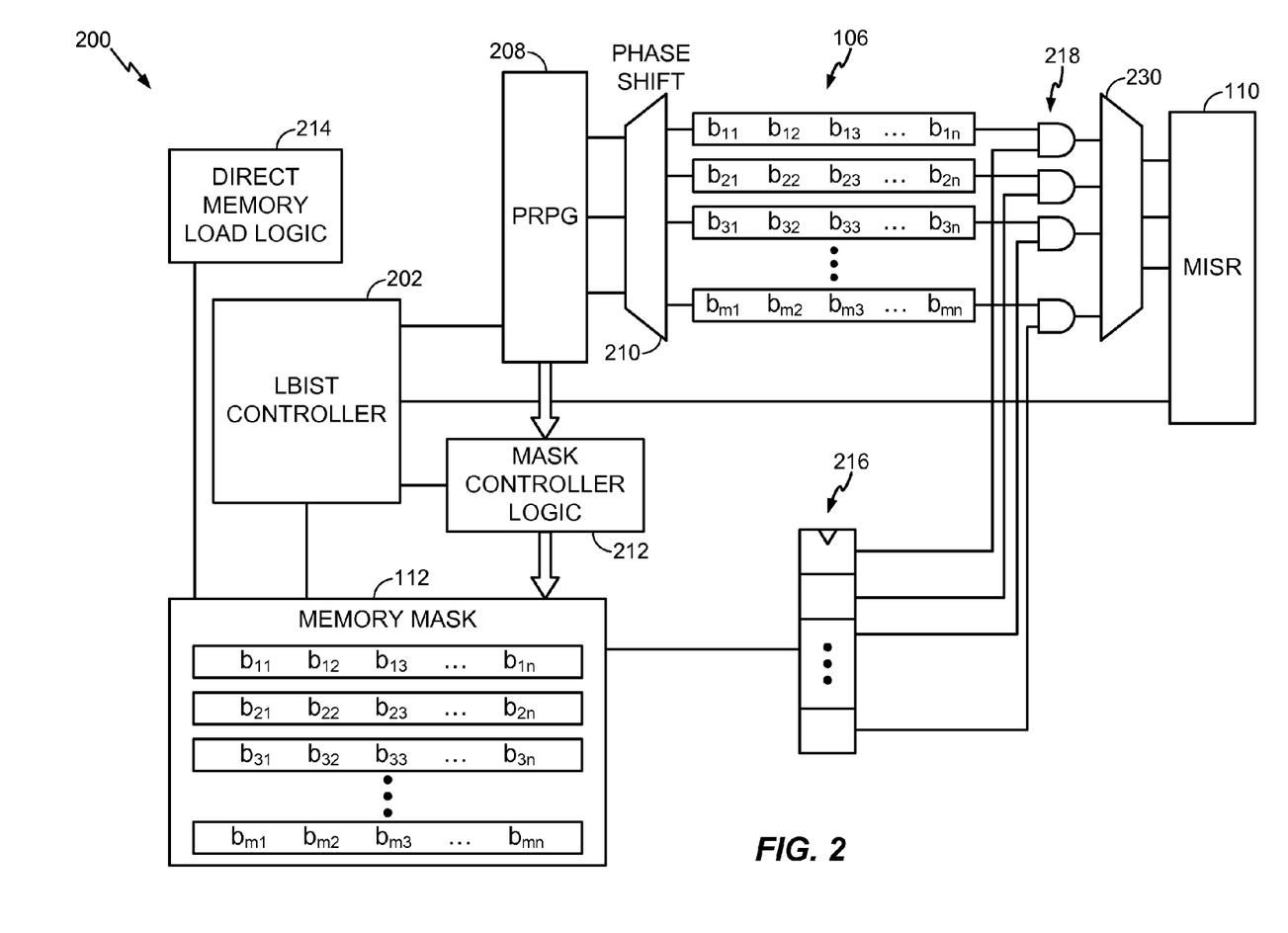
FIG. 2 is an illustrative block diagram of a second embodiment of a logic built-in self-test (LBIST) testing system having a memory mask applied to sub-portions of multiple scan chains.

Referring to FIG. 2, an illustrative block diagram of a second embodiment of a logic built-in self-test (LBIST) testing system having a memory mask applied to sub-portions of multiple scan chains is depicted and generally designated 200. The LBIST testing system 200 includes an LBIST controller 202 coupled to a memory mask 112. The LBIST controller 202 is also coupled to mask controller logic 212, which is also coupled to the memory mask 112. The LBIST controller 202 is further coupled to a pseudo-random pattern generator (PRPG) 208, which is coupled to a phase shift device 210. The PRPG 208 is coupled to the mask controller logic 212. The LBIST controller 202 is also coupled to a multiple input shift register (MISR) 110.

The phase shift device 210 is coupled to a set of m scan chains 106. The phase shift device 210 may be configured to modify data generated by the PRPG 208 to reduce correlations between different sets of scan chain data. For example, the phase shift device 210 may include an exclusive-OR (XOR) network that is configured to reduce or avoid shifted versions of the same data in various scan chains of the m scan chains 106.

Each of the m scan chains 106 has n cycles. The bit positions in the first of the m scan chains 106 may be labeled $b_{11}$, $b_{12}$, $b_{13}$, ..., $b_{1n}$. The bit positions in the second of the m scan chains 106 may be labeled $b_{21}$, $b_{22}$, $b_{23}$, ..., $b_{2n}$. The bit positions in the third of the m scan chains 106 may be labeled $b_{31}$, $b_{32}$, $b_{33}$, ..., $b_{3n}$. The bit positions in the m-th of the m scan chains 106 may be labeled $b_{m1}$, $b_{m2}$, $b_{m3}$, ..., $b_{mn}$. The memory mask 112 has a two-dimensional array of bit positions corresponding to the bit positions of the m scan chains 106. In the two-dimensional array, each row may correspond to a respective scan chain of the m scan chains 106 and each column may correspond to a respective cycle of the m scan chains 106. In an alternative embodiment, the memory mask 112 has a one-dimensional array of memory locations corresponding to the bit positions of the m scan chains 106. Generally, the memory mask 112 may have an array of memory locations corresponding to the bit positions of the m scan chains 106. The m scan chains 106 are coupled to the MISR 110 through masking circuitry 218. The memory mask 112 is coupled to the masking circuitry 218 through cycle circuitry 216. Direct memory load logic 214 is coupled to the memory mask 112.

In operation, the LBIST controller 202 causes the PRPG 208 and the phase shift device 210 to generate m sets of test data, similar to the m sets of test data 104 of FIG. 1, that are applied to a semiconductor device under test (DUT) via the m scan chains 106. For example, the m sets of test data may be propagated through the m scan chains 106 cycle-by-cycle until the m sets of test data reach the MISR 110. The MISR 110 may detect one or more failing bit positions within one or more of the m scan chains 106. For example, a circuit element of an integrated circuit being tested, corresponding to one of the bit positions of one of the m scan chains 106, may fail and the resulting pattern received at the MISR 110 may result in the MISR 110 generating a signature that indicates that at least one bit has failed that is not masked by the masking circuitry 218 (i.e., not identified as a failed bit within the memory mask 112). The MISR 110 may inform the LBIST controller 202 of the test failure due to one or more failing bit positions within the one or more of the m scan chains 106. Locations of the one or more failing bits may be determined via a diagnostic mode of the LBIST controller 202 that enables a read-out of the m scan chains 106 and a comparison to expected results. The LBIST controller 202 may map the failing bit positions within the m scan chains 106 to memory locations in the memory mask 112.

The respective memory locations in the memory mask 112 may correspond to the failing bit positions within the m scan chains 106. In a particular embodiment, mapping the failing bit positions within the m scan chains 106 to the memory locations in the memory mask 112 is a one-to-one mapping. For example, if the bit position $b_{23}$ were a failing bit position in the m scan chains 106, the memory location labeled $b_{23}$ in the memory mask 112 may correspond to the failing bit position $b_{23}$ in the m scan chains 106. In a particular embodiment, the direct memory load logic 214 may be used to map the failing bit positions within the m scan chains 106 to the memory locations in the memory mask 112. There may be multiple failing bit positions within the m scan chains 106 each mapped to a respective memory location in the memory mask 112. In this way, sub-portions of failing bit positions within the m scan chains 106 may be mapped to corresponding sub-portions of memory locations in the memory mask 112.

The LBIST controller 202 may re-execute LBIST testing on the semiconductor device under test (DUT) using the memory mask 112 to selectively mask one or more of the failing bit positions within the m scan chains 106. The mask controller logic 212, the memory mask 112, the cycle circuitry 216, and the masking circuitry 218 may be used to selectively mask the one or more of the failing bit positions within the m scan chains 106. Test data may be clocked into the m scan chains 106 and the readout of the memory mask 112 may be synchronized with the clock. Each clock cycle, the cycle circuitry 216 provides m bits to the AND gates of the masking circuitry 218. A logical "zero" value provided by the cycle circuitry 216 masks off the output of the associated AND gate of the masking circuitry 218 that is provided to a compressor 230 and to the MISR 110. A logical "one" value causes the associated AND gate of the masking circuitry 218 to pass the scan-out value to the compressor 230 and to the MISR 110.

In this manner, individual bit positions within a scan chain may be masked, instead of masking the entire scan chain. Similarly, multiple bit positions within a scan chain may be masked without masking the entire scan chain. A particular bit position $b_{jk}$ may be selectively masked because the particular scan chain (the j-th scan chain of the m scan chains 106) and the particular cycle (the k-th cycle of n cycles) are known. Multiple bit positions may be selectively masked similarly.

Figure 3:
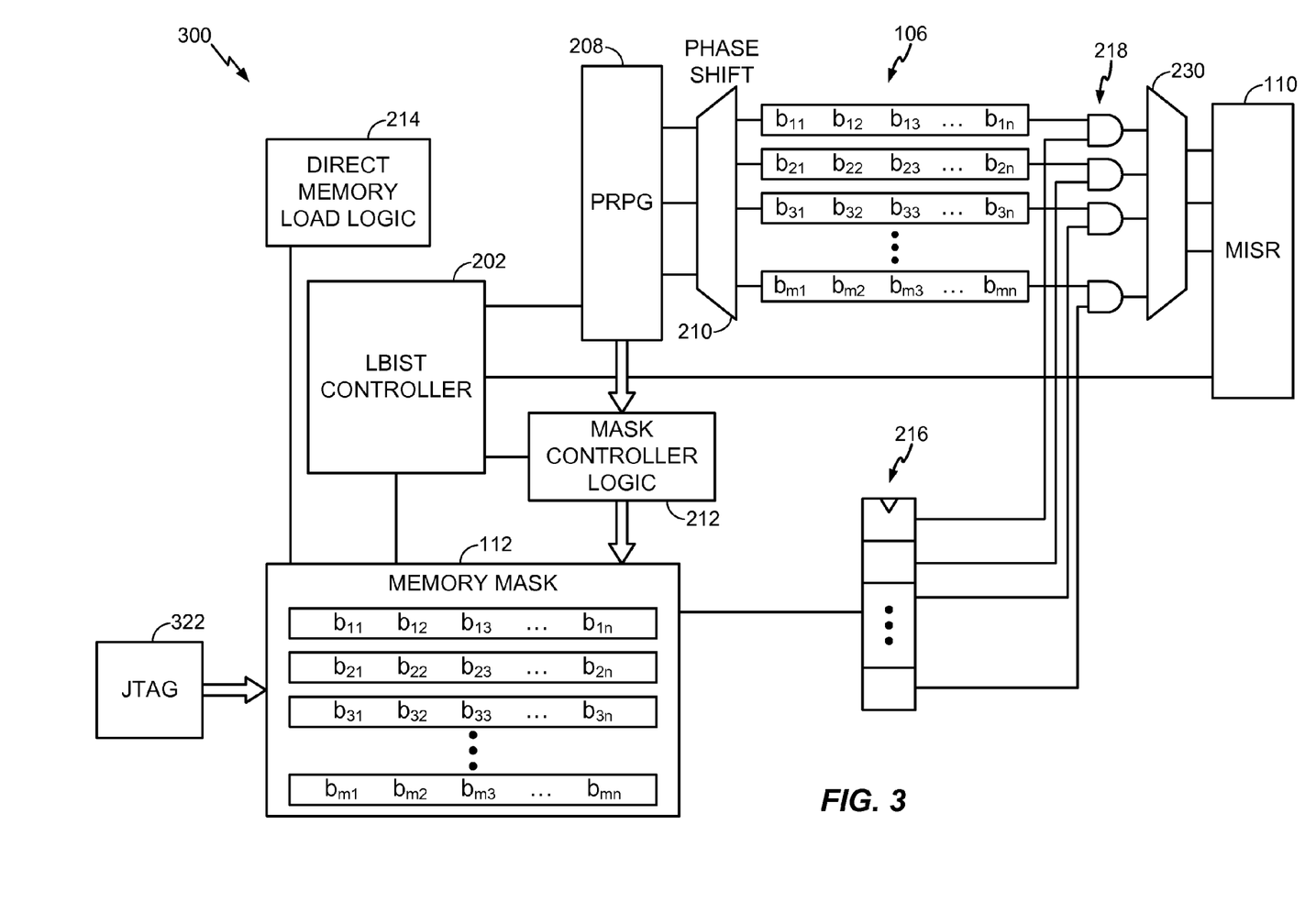
FIG. 3 is an illustrative block diagram of a third embodiment of a logic built-in self-test (LBIST) testing system having a memory mask applied to sub-portions of multiple scan chains.

Referring to FIG. 3, an illustrative block diagram of a third embodiment of a logic built-in self-test (LBIST) testing system having a memory mask applied to sub-portions of multiple scan chains is depicted and generally designated 300. The LBIST testing system 300 includes the LBIST testing system 200 of FIG. 2 and joint test action group (JTAG) logic 322. Joint test action group (JTAG) logic 322 is coupled to the memory mask 112.

In a particular embodiment, the JTAG logic 322 may be used to map the failing bit positions within the m scan chains 106 to the memory locations in the memory mask 112. The JTAG logic 322 may access the memory locations in the memory mask 112 that correspond to the failing bit positions within the m scan chains 106 and set the values at the respective memory locations accordingly.

Figure 4:
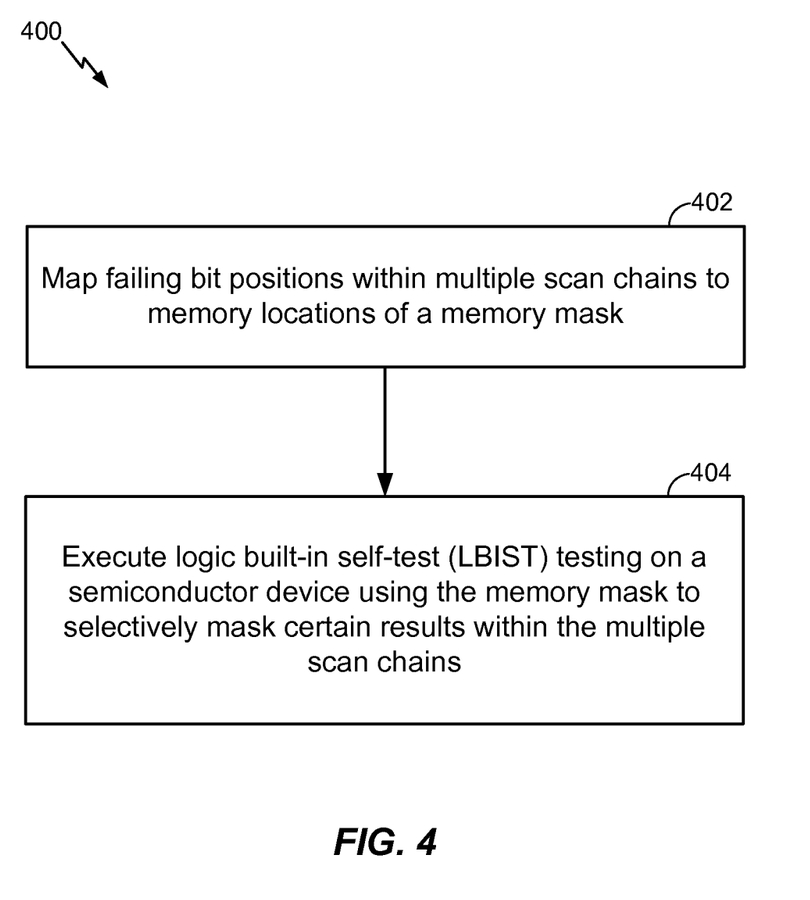
FIG. 4 is a flow diagram of a first illustrative embodiment of a method of logic built-in self-test (LBIST) testing applying a memory mask to sub-portions of multiple scan chains.

Referring to FIG. 4, a flow diagram of a first illustrative embodiment of a method of logic built-in self-test (LBIST) testing applying a memory mask to sub-portions of multiple scan chains is depicted and generally designated 400. The method 400 includes mapping failing bit positions within multiple scan chains to memory locations of a memory mask, at 402. For example, failing bit positions within the m scan chains 106 of FIG. 1 may be mapped to memory locations of the memory mask 112, as described above with reference to FIG. 1.

The method 400 also includes executing logic built-in self-test (LBIST) testing on a semiconductor device using the memory mask to selectively mask certain results within the multiple scan chains, at 404. For example, the LBIST controller 202 of FIG. 2 may re-execute LBIST testing on the semiconductor device under test (DUT) using the memory mask 112 to selectively mask one or more of the known failing bit positions within the m scan chains 106. One or more additional failing bits within the m scan chains 106 may be indicated by results associated with performance of LBIST testing on the semiconductor device under test (DUT), such as via a pass/fail indicator provided by the error detection circuit 110. Results from performance of LBIST testing on the semiconductor device under test (DUT) may be used to identify the one or more failing bit positions within the m scan chains 106, such as by entering a diagnostic mode in response to receiving a test failure indicator and comparing a scan chain read-out to expected results.

In a particular embodiment, the memory mask is configured to mask some but not all bits of the multiple scan chains. For example, the memory mask 112 may be configured to mask some but not all bits of the respective m scan chains 106. Similarly, the arrow 118 of FIG. 1 indicates that the memory mask 112 may be configured to mask a bit in the first scan chain of the m scan chains 106, and the arrow 120 indicates that the memory mask 112 may be configured to mask a bit in the m-th scan chain of the m scan chains 106.

In a particular embodiment, the memory mask 112 is configured to mask some but not all bits of a whole cycle of the respective m scan chains 106. Some but not all bits of the whole k-th cycle of n cycles may correspond to some but not all the bits $b_{jk}$ for j=1 to j=m. For example, the arrow 118 of FIG. 1 indicates that the memory mask 112 may be configured to mask a bit in a first cycle of n cycles of the m scan chains 106, and the arrow 120 indicates that the memory mask 112 may be configured to mask a bit in a second cycle of n cycles of the m scan chains 106, where the second cycle is different than the first cycle.

In a particular embodiment, the memory mask 112 is configured to mask individual bits of the respective m scan chains 106. For example, the arrow 118 of FIG. 1 indicates that the memory mask 112 may be configured to mask an individual bit in the first scan chain of the m scan chains 106, and the arrow 120 indicates that the memory mask 112 may be configured to mask an individual bit in the m-th scan chain of the m scan chains 106.

In a particular embodiment, the memory mask 112 is embedded within the semiconductor device under test (DUT). For example, the memory mask 112 may be one or more memory arrays included in an integrated circuit in the semiconductor device in which the integrated circuit is undergoing LBIST testing. In another particular embodiment, the memory mask 112 is external to the semiconductor device under test (DUT). For example, the memory mask 112 may be one or more memory arrays external to the semiconductor device in which an integrated circuit is undergoing LBIST testing, with the one or more external memory arrays coupled to the integrated circuit.

Figure 5:
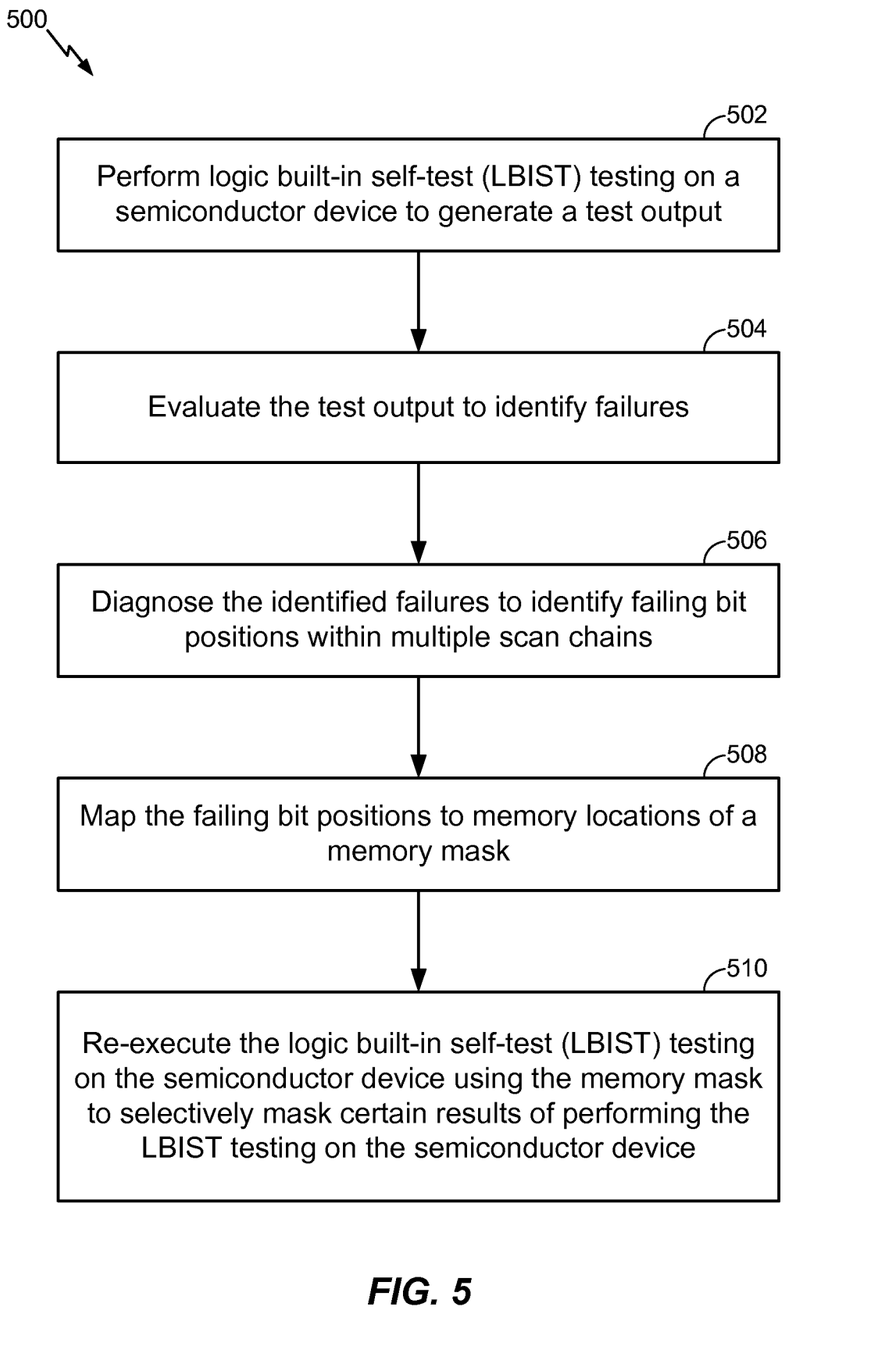
FIG. 5 is a flow diagram of a second illustrative embodiment of a method of logic built-in self-test (LBIST) testing applying a memory mask to sub-portions of multiple scan chains.

Referring to FIG. 5, a flow diagram of a second illustrative embodiment of a method of logic built-in self-test (LBIST) testing applying a memory mask to sub-portions of multiple scan chains is depicted and generally designated 500. The method 500 includes performing logic built-in self-test (LBIST) testing on a semiconductor device to generate a test output, at 502. For example, the LBIST circuitry 102 of FIG. 1 may generate the m sets of test data 104 that are applied to a semiconductor device under test (DUT), resulting in the m scan chains 106.

The method 500 also includes evaluating the test output to identify failures, at 504. For example, the error detection circuit 110 of FIG. 1 may detect one or more failures within one or more of the m scan chains 106. The error detection circuit 110 may inform the LBIST circuitry 102 that one or more failing bit positions are detected within the one or more of the m scan chains 106.

The method 500 further includes diagnosing the identified failures to identify failing bit positions within multiple scan chains, at 506. For example, one or more failing bit positions within one or more of the m scan chains 106 may be determined by comparing scan chain read-out results to expected results as a result of detecting one or more failures identified within one or more of the m scan chains 106. To illustrate, the LBIST may enter a diagnostic mode to enable scan chain read-out to an external ATE tester. The method 500 also includes mapping the failing bit positions to memory locations of a memory mask, at 508. For example, the LBIST circuitry 102 of FIG. 1 may map the failing bit positions within the m scan chains 106 to memory locations in the memory mask 112.

The method 500 further includes re-executing the logic built-in self-test (LBIST) testing on the semiconductor device using the memory mask to selectively mask certain results of performing the LBIST testing on the semiconductor device, at 510. For example, the LBIST controller 202 of FIG. 2 may re-execute LBIST testing on the semiconductor device under test (DUT) using the memory mask 112 to selectively mask one or more of the failing bit positions within the m scan chains 106. The one or more failing bit positions within the m scan chains 106 may be results of performing LBIST testing on the semiconductor device under test (DUT). Performing LBIST testing on the semiconductor device under test (DUT) may be used to identify the one or more failing bit positions within the m scan chains 106.

Figure 6:
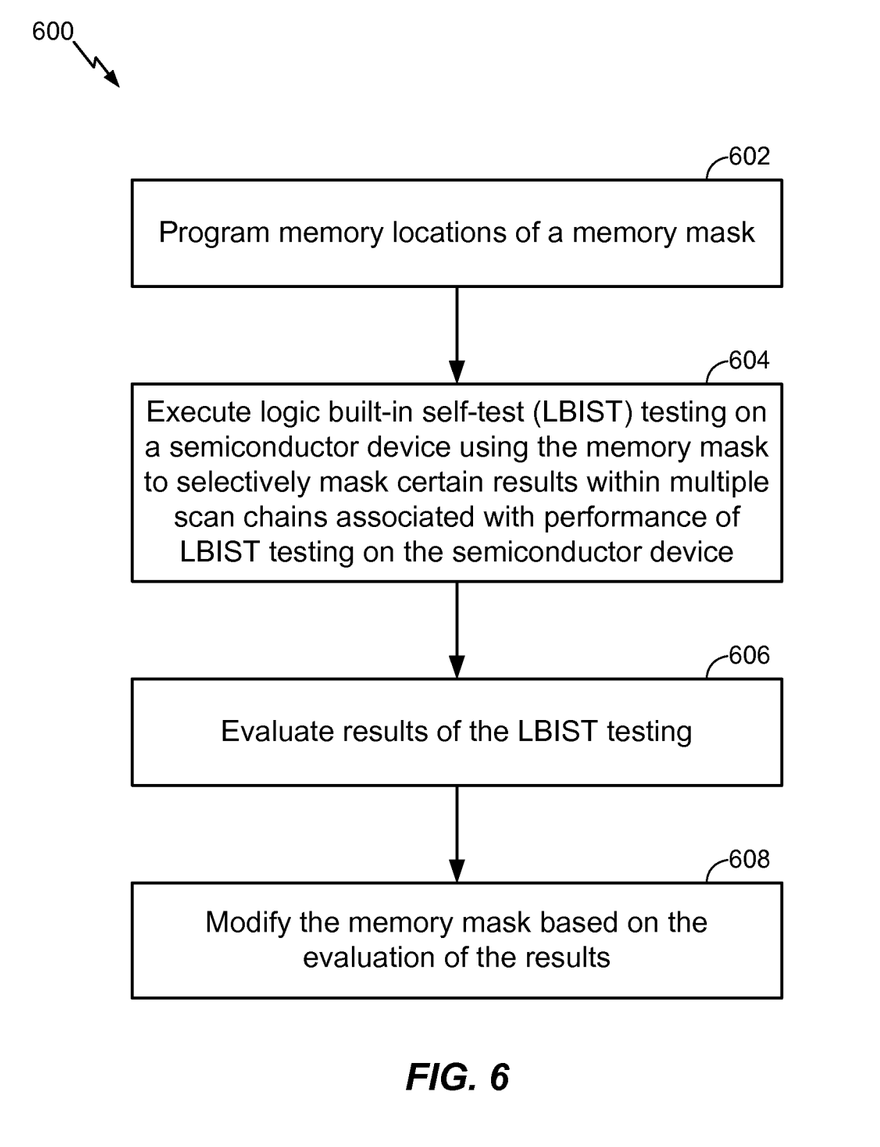
FIG. 6 is a flow diagram of a third illustrative embodiment of a method of logic built-in self-test (LBIST) testing applying a memory mask to sub-portions of multiple scan chains.

Referring to FIG. 6, a flow diagram of a third illustrative embodiment of a method of logic built-in self-test (LBIST) testing applying a memory mask to sub-portions of multiple scan chains is depicted and generally designated 600. The method 600 includes programming memory locations of a memory mask, at 602. For example, the direct memory load logic 214 of FIG. 2 may be used to program memory locations of the memory mask 112. Alternatively, the JTAG logic 322 of FIG. 3 may be used to program memory locations of the memory mask 112.

The method 600 also includes executing logic built-in self-test (LBIST) testing on a semiconductor device using the memory mask to selectively mask certain results within multiple scan chains associated with performance of LBIST testing on the semiconductor device, at 604. For example, the LBIST controller 202 of FIG. 2 may re-execute LBIST testing on the semiconductor device under test (DUT) using the memory mask 112 to selectively mask one or more of the failing bit positions within the m scan chains 106. The one or more failing bit positions within the m scan chains 106 may be identified by results associated with performance of LBIST testing on the semiconductor device under test (DUT). Results from performance of LBIST testing on the semiconductor device under test (DUT) may be used to identify the one or more failing bit positions within the m scan chains 106.

The method 600 further includes evaluating results of the LBIST testing, at 606. For example, the error detection circuit 110 of FIG. 1 may detect one or more failing bit positions within one or more of the m scan chains 106. The error detection circuit 110 may inform the LBIST circuitry 102 of the one or more failing bit positions within the one or more of the m scan chains 106.

The method 600 also includes modifying the memory mask based on the evaluation of the results, at 608. For example, the LBIST circuitry 102 of FIG. 1 may map the failing bit positions within the m scan chains 106 to memory locations in the memory mask 112.

In a particular embodiment, the method 600 further includes re-executing the LBIST testing with the modified memory mask. For example, the LBIST controller 202 of FIG. 2 may re-execute LBIST testing on the semiconductor device under test (DUT) using the modified memory mask 112 to selectively mask one or more of the failing bit positions within the m scan chains 106.

In a particular embodiment, a result of re-executing the LBIST testing indicates whether one or more bits have failed after modifying the memory mask. For example, the MISR 110 may generate a signature indicating that there are one or more failing bit positions within one or more of the m scan chains 106 that are not masked by the modified memory mask. The MISR 110 may inform the LBIST controller 202 of the one or more failing bit positions within the one or more of the m scan chains 106. The modified memory mask may be further modified based on the results of re-executing the LBIST testing with the modified memory mask. The LBIST testing may be further executed with the further modified memory mask, the process of executing the LBIST testing, and modifying the memory mask accordingly, continuing iteratively as needed.

The method 400 of FIG. 4, the method 500 of FIG. 5, and the method 600 of FIG. 6 may be initiated at a processor integrated into an electronic device. Alternatively, or in addition, one of skill in the art will recognize that the method 400 of FIG. 4, the method 500 of FIG. 5, and the method 600 of FIG. 6 may be implemented or initiated by an application-specific integrated circuit (ASIC), a central processing unit (CPU), a digital signal processor (DSP), a controller, a field programmable gate array (FPGA), another hardware device, or any combination thereof.

Figure 7:
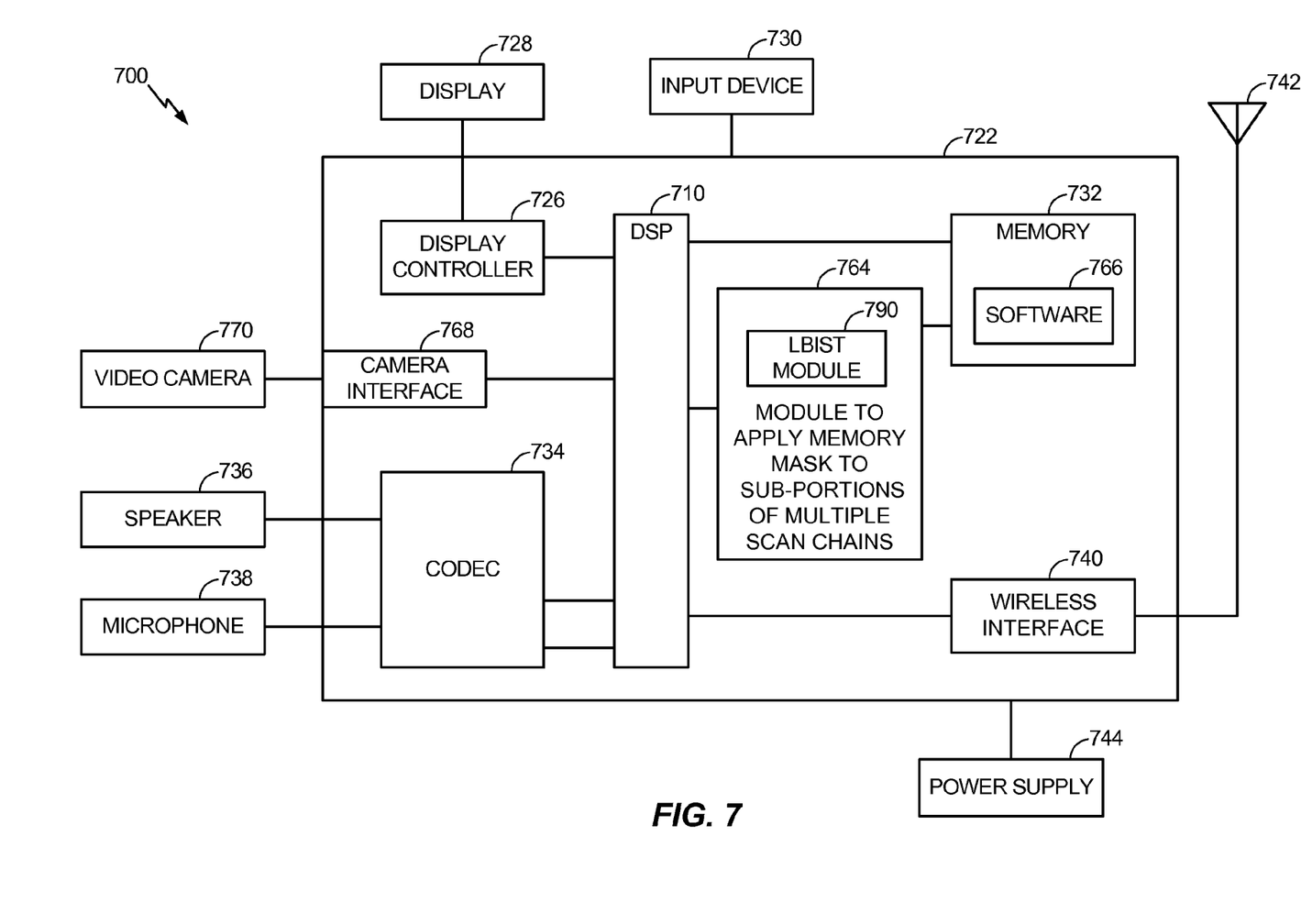
FIG. 7 is a block diagram of a particular embodiment of a wireless communication device including a module to apply a memory mask to sub-portions of multiple scan chains.

FIG. 7 is a block diagram of particular embodiment of a system 700 including a module to apply a memory mask to sub-portions of multiple scan chains 764. The system 700 may be implemented in a wireless electronic device and includes a processor 710, such as a digital signal processor (DSP), coupled to a computer readable medium, such as a memory 732, storing computer readable instructions, such as software 766. The system 700 includes the module to apply a memory mask to sub-portions of multiple scan chains 764. In an illustrative example, the module to apply a memory mask to sub-portions of multiple scan chains 764 includes any of the embodiments of a logic built-in self-test (LBIST) testing system having a memory mask applied to sub-portions of multiple scan chains of FIG. 1, FIG. 2, or FIG. 3, operated in accordance with any of the embodiments of a method of logic built-in self-test (LBIST) testing applying a memory mask to sub-portions of multiple scan chains of FIG. 4, FIG. 5, or FIG. 6, or any combination thereof. The processor 710 may be a separate device or circuitry coupled to the module to apply a memory mask to sub-portions of multiple scan chains 764 as shown, or may include the module (not shown). In a particular embodiment, as shown in FIG. 7, the module to apply a memory mask to sub-portions of multiple scan chains 764 includes an LBIST module 770 and is coupled to the memory 732. The module to apply a memory mask to sub-portions of multiple scan chains 764 may use the memory 732 as a memory mask. In production, during LBIST testing, the memory 732 is available and is not otherwise being used. Using the memory 732 as a memory mask is beneficial because the module to apply a memory mask to sub-portions of multiple scan chains 764 does not need another separate memory mask.

The module to apply a memory mask to sub-portions of multiple scan chains 764 may include an apparatus that includes an interface to a mask source, such as the memory 732 used as a memory mask. The apparatus may also include the LBIST module 770 configured to receive a mask from the mask source, such as the memory 732 used as a memory mask, and to apply the mask to a selected sub-portion of results of a test of multiple scan chains of LBIST testing on a semiconductor device. The LBIST module 770 may be an example of means for receiving a mask from a mask source and means for applying the mask to a selected sub-portion of results of a test of multiple scan chains of LBIST testing on a semiconductor device. Other examples of means for receiving a mask from a mask source and means for applying the mask to a selected sub-portion of results of a test of multiple scan chains of LBIST testing on a semiconductor device may include the LBIST circuitry 102 of FIG. 1 and the masking circuitry 108, and the LBIST controller 202 of FIG. 2 and the mask controller logic 212.

In a particular embodiment, the selected sub-portion is a single bit. For example, the arrow 118 of FIG. 1 indicates that the memory mask 112 may be configured to mask a bit in the first scan chain of the m scan chains 106, and the arrow 120 indicates that the memory mask 112 may be configured to mask a bit in the m-th scan chain of the m scan chains 106. In a particular embodiment, the mask source is a memory within the semiconductor device. For example, the mask source may be the memory 732 within the system 700. In a particular embodiment, the mask source is at least one of a memory, a tester, and a register. For example, the mask source may be an external tester used to test the semiconductor device and to selectively mask sub-portions of multiple scan chains during LBIST testing.

A camera interface 768 is coupled to the processor 710 and is also coupled to a camera, such as a video camera 770. A display controller 726 is coupled to the processor 710 and to a display device 728. A coder/decoder (CODEC) 734 can also be coupled to the processor 710. A speaker 736 and a microphone 738 can be coupled to the CODEC 734. A wireless interface 740 can be coupled to the processor 710 and to a wireless antenna 742.

In a particular embodiment, the module to apply a memory mask to sub-portions of multiple scan chains 764, the processor 710, the display controller 726, the memory 732, the CODEC 734, the wireless interface 740, and the camera interface 768 are included in a system-in-package or system-on-chip device 722. In a particular embodiment, an input device 730 and a power supply 744 are coupled to the system-on-chip device 722. Moreover, in a particular embodiment, as illustrated in FIG. 7, the display device 728, the input device 730, the speaker 736, the microphone 738, the wireless antenna 742, the video camera 770, and the power supply 744 are external to the system-on-chip device 722. However, each of the display device 728, the input device 730, the speaker 736, the microphone 738, the wireless antenna 742, the video camera 770, and the power supply 744 can be coupled to a component of the system-on-chip device 722, such as an interface or a controller.

Those of skill would further appreciate that the various illustrative logical blocks, configurations, modules, circuits, and method steps described in connection with the embodiments disclosed herein may be implemented as electronic hardware, computer software executed by a processing unit, or combinations of both. Various illustrative components, blocks, configurations, modules, circuits, and steps have been described above generally in terms of their functionality. Whether such functionality is implemented as hardware or executable processing instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), a magnetoresistive random access memory (MRAM), a spin-torque-transfer magnetoresistive random access memory (STT-MRAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
mapping failing bit positions within multiple scan chains to memory locations of a memory mask; and
executing logic built-in self-test (LBIST) testing on a semiconductor device using the memory mask to selectively mask certain results within the multiple scan chains, the results associated with performance of LBIST testing on the semiconductor device.

2. The method of claim 1, wherein the memory mask is configured to mask some but not all bits of the multiple scan chains.

3. The method of claim 1, wherein the memory mask is configured to mask some but not all bits of a whole cycle of a plurality of scan chains.

4. The method of claim 1, wherein the memory mask is configured to mask individual bits of the multiple scan chains.

5. The method of claim 1, wherein mapping the failing bit positions to the memory locations of the memory mask is a one-to-one mapping.

6. The method of claim 5, wherein the memory locations of the memory mask are arranged in a two-dimensional array, each row corresponding to a respective scan chain of the multiple scan chains and each column corresponding to a respective cycle of the multiple scan chains.

7. The method of claim 1, wherein the memory mask is embedded within the semiconductor device.

8. The method of claim 1, wherein the memory mask is external to the semiconductor device.

9. A method comprising:
performing logic built-in self-test (LBIST) testing on a semiconductor device to generate a test output;
evaluating the test output to identify failures;
diagnosing the identified failures to identify failing bit positions within multiple scan chains; mapping the failing bit positions to memory locations of a memory mask; and
re-executing the logic built-in self-test (LBIST) testing on the semiconductor device using the memory mask to selectively mask certain results of performing the LBIST testing on the semiconductor device.

10. The method of claim 9, wherein the memory mask is configured to mask some but not all bits of the multiple scan chains.

11. The method of claim 9, wherein the memory mask is configured to mask some but not all bits of a whole cycle of a plurality of scan chains.

12. The method of claim 9, wherein the memory mask is configured to mask individual bits of the multiple scan chains.

13. The method of claim 9, wherein mapping the failing bit positions to the memory locations of the memory mask is a one-to-one mapping.

14. The method of claim 9, wherein the memory mask is embedded within the semiconductor device.

15. The method of claim 9, wherein the memory mask is external to the semiconductor device.

16. A method comprising:
programming memory locations of a memory mask;
executing logic built-in self-test (LBIST) testing on a semiconductor device using the memory mask to selectively mask certain results within multiple scan chains associated with performance of LBIST testing on the semiconductor device;
evaluating results of the LBIST testing; and
modifying the memory mask based on the evaluation of the results.

17. The method of claim 16, further comprising re-executing the LBIST testing with the modified memory mask.

18. The method of claim 17, wherein a result of re-executing the LBIST testing indicates whether one or more bits have failed after modifying the memory mask.

19. An apparatus comprising:
an interface to a mask source; and
a logic built-in self-test (LBIST) module configured to receive a mask from the mask source, wherein the mask corresponds to one or more failing bit positions diagnosed from an LBIST operation, and to apply the mask to a selected sub-portion of results of a test of multiple scan chains of LBIST testing on a semiconductor device.

20. The apparatus of claim 19, wherein the selected sub-portion comprises a single bit, multiple bits in a single scan chain, or multiple bits in multiple scan chains.

21. The apparatus of claim 19, wherein the mask source is a memory within the semiconductor device.

22. The apparatus of claim 19, wherein the mask source is at least one of a memory, a tester, and a register.

23. An apparatus comprising:
means for receiving a mask from a mask source, wherein the mask corresponds to one or more failing bit positions diagnosed from a logic built-in self-test (LBIST) operation; and
means for applying the mask to a selected sub-portion of results of a test of multiple scan chains of LBIST testing on a semiconductor device.

24. The apparatus of claim 23, wherein the selected sub-portion comprises a single bit, multiple bits in a single scan chain, or multiple bits in multiple scan chains.

25. The apparatus of claim 23, wherein the mask source is a memory within the semiconductor device.

26. The apparatus of claim 23, wherein the mask source is at least one of a memory, a tester, and a register.

27. A non-transitory computer readable medium comprising instructions that, when executed by a processor, cause the processor to:
program memory locations of a memory mask;
execute logic built-in self-test (LBIST) testing on a semiconductor device using the memory mask to selectively mask certain results within multiple scan chains associated with performance of LBIST testing on the semiconductor device;
evaluate results of the LBIST testing; and
modify the memory mask based on the evaluation of the results.

28. The non-transitory computer readable medium of claim 27, further comprising instructions executable by the processor to re-execute the LBIST testing with the modified memory mask.

29. The non-transitory computer readable medium of claim 28, wherein a result of re-executing the LBIST testing indicates whether one or more bits have failed after modifying the memory mask.

* * * * *